US012738454B2

(12) United States Patent
Moon et al.

(10) Patent No.: US 12,738,454 B2
(45) Date of Patent: Sep. 15, 2026

(54) SUBSTRATE PROCESSING APPARATUS

(71) Applicant: Samsung Electronics Co., Ltd., Suwon-si (KR)

(72) Inventors: Jongbeom Moon, Suwon-si (KR); Hadong Jin, Suwon-si (KR); Kyung-Sun Kim, Suwon-si (KR); Sung-Yeol Kim, Suwon-si (KR); Hyosin Kim, Suwon-si (KR); Donghyeon Na, Suwon-si (KR); Chunyoon Park, Suwon-si (KR); Sungyong Lim, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 88 days.

(21) Appl. No.: 18/769,769

(22) Filed: Jul. 11, 2024

(65) Prior Publication Data

US 2025/0246403 A1 Jul. 31, 2025

(30) Foreign Application Priority Data

Jan. 26, 2024 (KR) ........................ 10-2024-0012373

(51) Int. Cl.
*H01J 37/32* (2006.01)

(52) U.S. Cl.
CPC .. *H01J 37/32174* (2013.01); *H01J 37/32091* (2013.01); *H01J 37/32724* (2013.01)

(58) Field of Classification Search
None
See application file for complete search history.

(56) References Cited

U.S. PATENT DOCUMENTS 7,169,256 B2 1/2007 Dhindsa et al.
7,307,029 B2 * 12/2007 Yamazaki ........... C23C 16/4557 438/795
7,393,432 B2 7/2008 Dhindsa et al.
7,462,572 B2 * 12/2008 Yamazaki ......... H01J 37/32761 438/795
8,689,733 B2 4/2014 Koshimizu et al.
9,204,950 B2 * 12/2015 Liu ........................ A61C 19/00
9,536,711 B2 1/2017 Dhindsa et al.
10,264,663 B1 * 4/2019 Long ........................ H05H 1/46
10,304,660 B1 * 5/2019 Shoeb ............... H01J 37/32146
10,354,838 B1 * 7/2019 Mopidevi ......... H01J 37/32183
10,529,539 B2 1/2020 Koshiishi et al.
10,553,407 B2 2/2020 Nagami et al.
(Continued)

FOREIGN PATENT DOCUMENTS

GB 942013 A * 11/1963 ............. D06B 15/02
KR 101177335 B1 8/2012
(Continued)

*Primary Examiner* — Srinivas Sathiraju
(74) *Attorney, Agent, or Firm* — Fish & Richardson P.C.

(57) ABSTRACT

Various example embodiments of the present disclosure provide a substrate processing apparatus including a chamber, an excitation power supply configured to generate a supply power for plasma excitation, a support inside the chamber configured to support a substrate, and a filter connected to the support. The filter is configured to change frequency characteristics of the supply power by changing an impedance of the filter based on a change in an output level of the excitation power supply.

20 Claims, 13 Drawing Sheets

(56) References Cited

U.S. PATENT DOCUMENTS 10,621,265 B2* 4/2020 Howald ................. G06F 30/36
10,853,444 B2* 12/2020 Howald ................. G06F 17/11
11,495,470 B1* 11/2022 Zhou ................ H01L 21/31116
11,694,876 B2* 7/2023 Rogers ............. H01J 37/32091 438/714
2004/0255863 A1* 12/2004 Higashiura ....... H01J 37/32082 118/723 E
2005/0264218 A1 12/2005 Dhindsa et al.
2006/0189170 A1* 8/2006 Yamazaki ........... C23C 16/4583 438/795
2008/0085377 A1* 4/2008 Yamazaki ........... C23C 16/5093 427/569
2008/0277062 A1 11/2008 Koshimizu et al.
2009/0159439 A1* 6/2009 Pipitone ........... H01J 37/32183 204/298.03
2011/0209995 A1 9/2011 Rasheed et al.
2013/0277333 A1* 10/2013 Misra ................ H01J 37/32183 216/61
2014/0167613 A1* 6/2014 Fong ....................... H05H 1/46 315/111.21
2014/0214350 A1* 7/2014 Valcore, Jr. ....... H01J 37/32697 702/64
2014/0214351 A1* 7/2014 Valcore, Jr. ....... H01J 37/32183 702/65
2015/0091440 A1* 4/2015 Marakhtanov .... H01J 37/32183 315/111.21
2015/0091441 A1* 4/2015 Marakhtanov .... H01J 37/32174 315/111.21
2015/0301100 A1* 10/2015 Valcore, Jr. ....... H01J 37/32183 702/59
2016/0109863 A1* 4/2016 Valcore, Jr. ............ G06F 30/20 703/2
2016/0118227 A1* 4/2016 Valcore, Jr. ....... H01J 37/32165 216/61
2019/0108976 A1 4/2019 Van Zyl
2019/0272306 A1* 9/2019 Howald ............ H01J 37/32183
2020/0218774 A1* 7/2020 Howald ................ G06F 30/367
2020/0343123 A1* 10/2020 Ye ....................... H01L 21/6833
2020/0411288 A1* 12/2020 Wang ................ H01J 37/32935
2021/0257188 A1* 8/2021 Juco .................. H01J 37/32357
2021/0366695 A1* 11/2021 Galstyan ............. H01L 21/6831
2021/0398778 A1* 12/2021 Kim .................. H01J 37/32183
2022/0037121 A1* 2/2022 Dorf ................. H01J 37/32128
2022/0130642 A1* 4/2022 Kawasaki ......... H01J 37/32183
2022/0336222 A1* 10/2022 Zhou ................. H01J 37/32146
2022/0399189 A1* 12/2022 Guo .................. H01J 37/32183
2022/0399193 A1* 12/2022 Cui ................... H01J 37/32128
2022/0406565 A1* 12/2022 Chen ................. H01J 37/32183
2023/0005723 A1* 1/2023 Kim .................. H01L 21/67069
2023/0087307 A1* 3/2023 Guo .................. H01J 37/32183 315/111.21
2023/0091584 A1* 3/2023 Torii ................. H01J 37/32091 315/111.21
2023/0134296 A1* 5/2023 Benjamin ......... H01J 37/32174 336/84 C
2023/0178336 A1* 6/2023 Rogers .............. H01J 37/32091 438/714
2023/0187184 A1* 6/2023 Ishikawa ........... H01J 37/32146 216/67
2023/0207285 A1* 6/2023 Koshimizu ....... H01J 37/32091 156/345.48
2023/0253185 A1* 8/2023 Lyndaker .......... H01J 37/32183 315/111.21
2023/0298857 A1* 9/2023 Bhowmick ....... H01J 37/32091 315/111.21
2023/0317414 A1* 10/2023 Marakhtanov .... H01J 37/32183 315/111.21
2024/0162008 A1* 5/2024 Guo ....................... H03H 11/28
2024/0194447 A1* 6/2024 Guo .................. H01J 37/32091
2024/0371605 A1* 11/2024 Guo .................. H01J 37/32183
2024/0404791 A1* 12/2024 Bhutta .............. H01J 37/32183
2024/0412947 A1* 12/2024 Guo .................. H01J 37/32183
2025/0046576 A1* 2/2025 Guo .................. H01J 37/32706
2025/0087461 A1* 3/2025 Dash ................. H01J 37/32146
2025/0087462 A1* 3/2025 Guo .................. H01L 21/67069
2025/0140541 A1* 5/2025 Guo .................. H01J 37/32935
2025/0191884 A1* 6/2025 Dash ................. H01J 37/32935
2025/0218727 A1* 7/2025 Lim .................. H01J 37/32128
2025/0218748 A1* 7/2025 Guo .................. H01J 37/32183
2025/0246403 A1* 7/2025 Moon ............... H01J 37/32174

FOREIGN PATENT DOCUMENTS

KR 101890158 B1 9/2018
KR 2020-0135114 A 12/2020
KR 102225605 B1 3/2021

* cited by examiner

SUBSTRATE PROCESSING APPARATUS

CROSS-REFERENCE TO RELATED APPLICATION

This application claims priority to and the benefit of Korean Patent Application No. 10-2024-0012373, filed in the Korean Intellectual Property Office on Jan. 26, 2024, the entire contents of which are incorporated herein by reference.

BACKGROUND

Various example embodiments relate to a substrate processing apparatus.

To manufacture semiconductor devices, various processes such as photolithography, etching, ashing, ion implantation, thin film deposition, and cleaning are performed on a substrate so as to form a desired pattern on the substrate. Among these processes, the etching process is a process of removing a selected region in films formed on the substrate, and processes such as wet etching and dry etching are used.

An etching device using plasma may be used for dry etching. Generally, in order to form plasma, an electromagnetic field is generated in an internal space of a chamber, and the electromagnetic field excites a process gas provided in the chamber into a plasma state.

Plasma refers to an ionized gas state including ions, electrons, radicals, etc. Plasma may be generated by very high temperatures, strong electric fields, and/or RF electromagnetic fields. A semiconductor device manufacturing process may perform an etching process using plasma. The etching process may be performed by ions contained in the plasma colliding with the substrate.

SUMMARY

Various example embodiments attempt to provide a substrate processing apparatus, capable of effectively processing a substrate even if characteristics of plasma are changed and impedance characteristics inside a chamber are changed.

However, the problem to be solved by the various example embodiments is not limited to the above-described problems, and can be variously extended within the scope of the technical spirit included in the example embodiments.

Various example embodiments provide a substrate processing apparatus including a chamber, an excitation power supply configured to generate a supply power for plasma excitation, a support inside the chamber configured to support a substrate, and a filter connected to the support. The filter is configured to change frequency characteristics of the supply power by changing an impedance of the filter based on a change in an output level of the excitation power supply.

Various example embodiments provide a substrate processing apparatus including a chamber, an excitation power supply configured to generate a supply power for plasma excitation, a support inside the chamber configured to support a substrate, a bias power supply connected to the support to supply bias power, a plasma excitation plate configured to supply plasma excitation energy into the chamber, and a filter connected to the support or the plasma excitation plate. The filter is configured to change frequency characteristics of the supply power by changing an impedance of the filter based on an output level of the excitation power supply or an output level of the bias power supply.

Various example embodiments provide a substrate processing apparatus including a chamber, an excitation power supply is configured to generate a supply power for plasma excitation, a support inside the chamber configured to support a substrate, a bias power supply connected to the support and configured to supply bias power, and a filter between the support and the bias power supply, and the filter including one or more switches. One or more switches are configured to change frequency characteristics of the supply power by changing between on and off states based on an output level of the excitation power supply changing or an output level of the bias power supply changing.

According to various example embodiments, it may be possible to provide a substrate processing apparatus, capable of effectively processing a substrate even if characteristics of plasma are changed and impedance characteristics inside a chamber are changed.

DETAILED DESCRIPTION

Figure 1:
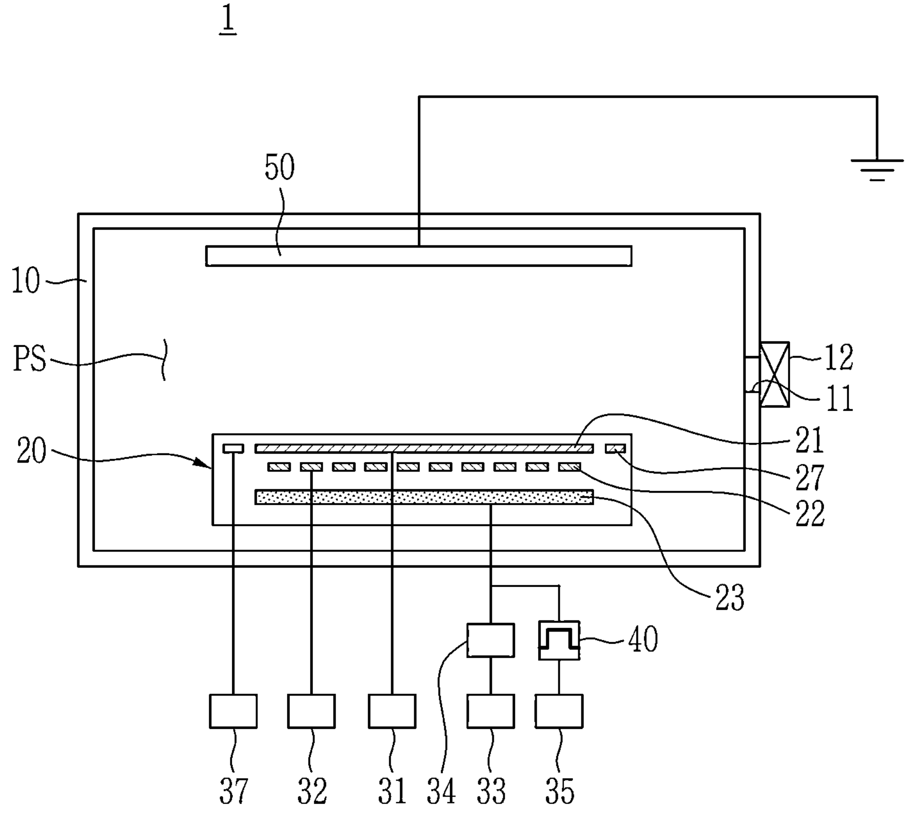
FIG. 1 illustrates a substrate processing apparatus according to various example embodiments.

Various example embodiments will be described more fully hereinafter with reference to the accompanying drawings, in which various example embodiments of the disclosure are shown. As those skilled in the art would realize, the described example embodiments may be modified in various different ways, all without departing from the spirit or scope of the present disclosure.

To clearly describe the example embodiments, parts that are irrelevant to the description are omitted, and like numerals may refer to like or similar components throughout the specification.

Further, since sizes and thicknesses of constituent elements shown in the accompanying drawings are arbitrarily given for better understanding and ease of description, various example embodiments are not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means when an object portion is viewed from above, and the phrase "in a cross-sectional view" means when a cross-section taken by vertically cutting an object portion is viewed from the side.

FIG. 1 illustrates a substrate processing apparatus 1 according to various example embodiments.

Referring to FIG. 1, the substrate processing apparatus 1 may include a chamber 10, a support 20, and a plasma excitation plate 50.

The substrate processing apparatus 1 processes a substrate using plasma. For example, the substrate processing apparatus 1 may perform an etching process using excited plasma. The substrate may be a wafer for manufacturing a semiconductor device.

The chamber 10 provides a process space PS within which a substrate processing process is performed. The chamber 10 has the internal process space (PS), and may be provided in a sealed shape. An opening 11 may be positioned at a first side of the chamber 10. The opening 11 may be opened and closed by a door 12. The chamber 10 may be made of a metallic material. For example, the chamber 10 may be made of an aluminum material. The chamber 10 may be grounded.

The support 20 is disposed inside the chamber 10. The support 20 may be disposed at a lower portion of the process space PS. The support 20 supports the substrate. The support 20 may secure the substrate using an electrostatic force. The support 20 may include a plurality of components. The support 20 may include an electrostatic chuck (ESC) and a focus ring.

The electrostatic chuck may be disposed on an upper portion of the support 20. Accordingly, the substrate may be disposed on an upper surface of the electrostatic chuck. The upper surface of the electrostatic chuck may be made of a dielectric material. The focus ring may be disposed in an upper outer region of the support 20. The focus ring may be disposed on outer circumference of an upper portion of the electrostatic chuck.

A fixing electrode 21 may be disposed inside the support 20. The fixing electrode 21 may be disposed inside the electrostatic chuck. A fixing power supply 31 may be connected to the support 20. The fixing power supply 31 may be electrically connected to the fixing electrode 21. The fixing power supply 31 includes a DC power source. An electrostatic force is generated between the fixing electrode 21 and the substrate by a voltage applied by the fixing power supply 31, and the electrostatic force causes the substrate to be fixed to the support 20.

A heater (e.g., a heating electrode) 22 may be disposed inside the support 20. The heating electrode 22 may be disposed inside the electrostatic chuck. If an electric power is applied, the heating electrode 22 generates heat through resistance heating, causing the substrate positioned on the support 20 to be heated. The heating electrode 22 is made of a conductive material. The heating electrode 22 may be disposed below the fixing electrode 21.

A heater power supply 32 may be connected to the support 20. The heater power supply 32 may be electrically connected to the heating electrode 22. The heating electrode 22 may be resistively heated by an electric power supplied by the heater power supply 32, so that the substrate positioned on the support 20 may be heated.

A lower electrode 23 may be disposed inside the support 20. The lower electrode 23 may be made of a conductive material. The lower electrode 23 may be made of a metallic material.

An excitation power supply 33 may be connected to the support 20. The excitation power supply 33 may be electrically connected to the lower electrode 23. The excitation power supply 33 may be provided as a high-frequency power source that generates a high-frequency power. The excitation power supply 33 may be provided as an RF power source. The excitation power supply 33 provides an electric power for plasma excitation. A matcher 34 may be disposed between the excitation power supply 33 and the lower electrode 23. The matcher 34 performs impedance matching between the excitation power supply 33 and the lower electrode 23. Additionally, the excitation power supply 33 electrically connected to the lower electrode 23 may be omitted, and the lower electrode 23 may be grounded.

A bias power supply 35 may be connected to the support 20. The bias power supply 35 may be electrically connected to the lower electrode 23. Accordingly, the lower electrode 23 may function as a bias electrode. The bias power supply 35 provides a power for bias. A sheath state, a concentration state of plasma on the substrate, a state of incidence of ions on the substrate, etc. may be adjusted in a region adjacent to the upper surface of the support 20 by the power supplied by the bias power supply 35. A frequency of the bias power supply 35 is provided to be lower than a frequency of the excitation power supply 33. For example, the frequency of the excitation power supply 33 may be 50 MHz to several hundred MHz, and the frequency of the bias power supply 35 may be 0.1 MHz to 15 MHz.

The bias power supply 35 may be connected to the support 20 through the filter 40. That is, the filter 40 may be connected to the support 20 to be disposed between the support 20 and the bias power supply 35. The bias power supply 35 may be electrically connected to the lower electrode 23 through the filter 40. That is, the filter 40 may be disposed between the lower electrode 23 and the bias power supply 35. The filter 40 blocks or reduces high frequency components entering from the lower electrode 23 toward the bias power supply 35. Accordingly, an output waveform of the bias power supply 35 may be applied to the support 20 with distortion of the waveform being prevented, reduced, and/or minimized, thereby improving the yield of the manufactured semiconductor device.

An edge bias electrode 27 may be disposed in the support 20. The edge bias electrode 27 may be disposed at an upper end portion of an edge region of support 20. For example, the edge bias electrode 27 may be disposed below the edge region of the upper surface of the support 20. In addition, the edge bias electrode 27 may be provided to be exposed to the edge region of the upper surface of the support 20. That is, the focus ring may function as the edge bias electrode 27. An edge bias power supply 37 may be connected to the support 20. The edge bias power supply 37 may be electrically connected to the edge bias electrode 27. A sheath state, a concentration state of plasma on the substrate, a state of incidence of ions on the substrate, etc. may be adjusted in a region adjacent to an edge region of the upper surface of the support 20 by the power supplied by the edge bias power supply 37. A frequency of the edge bias power supply 37 is provided to be lower than a frequency of the excitation power supply 33. The frequency of the edge bias power supply 37 may correspond to the frequency of the bias power supply 35.

The plasma excitation plate 50 allows energy for excitation of plasma to be applied to the process space PS. A lower surface of the plasma excitation plate 50 may be disposed to face an inside of the chamber 10. The plasma excitation plate 50 may be disposed inside the chamber 10. For example, the plasma excitation plate 50 may be manufactured separately from the chamber 10 to be connected to the chamber 10. Alternatively, the plasma excitation plate 50 may be provided integrally with an upper structure of the chamber 10. That is, the upper structure of the chamber 10 may function as the plasma excitation plate 50.

The plasma excitation plate 50 may be disposed at the upper portion of the process space PS. The plasma excitation plate 50 may be made of a conductive material, and may be provided to have a desired (or, alternatively an empirically or predetermined) area. The plasma excitation plate 50 may be disposed to face the support 20 in the vertical direction.

A process gas introduced into the chamber 10 may be excited into plasma by an electric field formed inside the chamber 10. Specifically, the process gas can be excited into plasma by a capacitively coupled plasma (CCP) source. The capacitively coupled plasma source may include an upper electrode and a lower electrode 23. The upper electrode and the lower electrode 23 may be disposed to face each other in the vertical direction. An electromagnetic field is formed in the space between the upper electrode and the lower electrode 23 by applying high frequency power to at least one of the upper electrode or the lower electrode 23, and the process gas supplied to this space may be excited into a plasma state. The upper electrode may be a plasma excitation plate 50. The excitation power supply 33 may be connected to one of the upper electrode and the lower electrode 23. For example, the upper electrode may be grounded, and the excitation power supply 33 may be connected only to the lower electrode 23. Additionally, the lower electrode 23 may be grounded, and the excitation power supply 33 may be connected to the upper electrode. Additionally, the excitation power supply 33 may be connected to both the upper electrode and the lower electrode 23. In FIG. 1, a case where the excitation power supply 33 is connected to the lower electrode 23 is illustrated.

Figure 2:
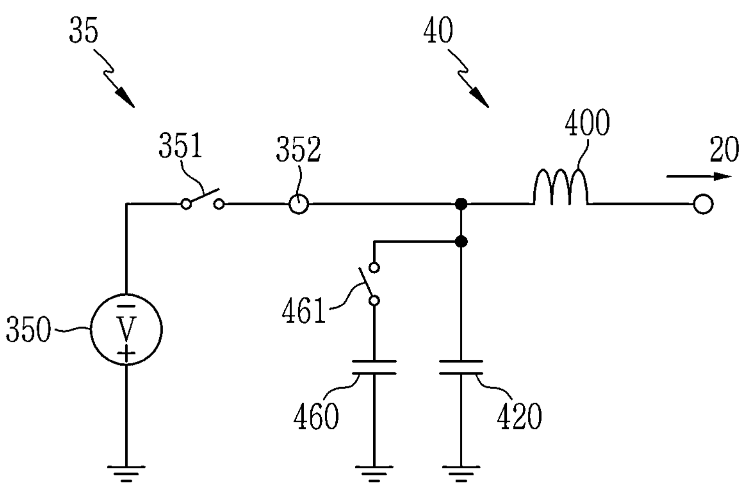
FIG. 2 illustrates a bias power supply and a filter of FIG. 1.

FIG. 2 illustrates the bias power supply 35 and the filter 40 of FIG. 1.

Referring to FIG. 2, the bias power supply 35 may include a bias power supply 350 and a bias switch 351.

The bias power supply 350 may be provided as a voltage source. The bias power supply 350 may be provided as a direct current voltage source. A first end of the bias power supply 350 may be grounded. A positive (first) terminal of the bias power supply 350 may be grounded.

The bias switch 351 is connected to a second terminal of the bias power supply 350. The bias switch 351 may be disposed in a direction of an output terminal 352 of the bias power supply 35. The bias switch 351 may be disposed between bias power supply 350 and the filter 40. The bias switch 351 may include a power semiconductor device. For example, the power semiconductor device may be an insulated gate bipolar transistor (IGBT), a power MOSFET, etc. In addition, the power semiconductor device may be controlled by a gate driver to operate at a speed of several nanoseconds (nsec) to hundreds of nsec. If the bias switch 351 is turned on, a negative voltage output by the bias power supply 350 is applied toward the lower electrode 23, and if the bias switch 351 is turned off, a voltage of the bias power supply 350 may be blocked at the lower electrode 23. If the bias switch 351 is in an off state, the output terminal 352 of the bias power supply 35 may be connected to the ground. According to an on/off operation of the bias switch 351, the bias power supply 35 may output a square wave voltage.

The filter 40 is provided to include at least one shunt control switch 461. Accordingly, impedance and frequency characteristics of the filter 40 may change according to a change in an on/off state of the shunt control switch 461.

The filter 40 may include a series filter 400, a shunt filter 420, and a shunt control filter 460.

A first end of the series filter 400 is connected in a direction of the output terminal 352 of the bias power supply 35. A second end of the series filter 400 is connected in a direction of the support 20. The second end of the series filter 400 may be electrically connected to the lower electrode 23. The series filter 400 is provided as a passive element. The series filter 400 may be provided as a reactance element. The series filter 400 may be provided as an inductive reactor element.

A first end of the shunt filter 420 is connected in a direction of the output terminal 352 of the bias power supply 35. A first end of the shunt filter 420 may be connected to a first end of the series filter 400. A second end of the shunt filter 420 is connected to ground. The shunt filter 420 is provided as a passive element. The shunt filter 420 may be provided as a reactance element. The shunt filter 420 may be provided as a capacitive reactor element.

The shunt control filter 460 is connected in parallel to the shunt filter 420. The shunt control filter 460 is provided as a passive element. The shunt control filter 460 may be provided as a reactance element. The shunt control filter 460 may be provided as a capacitive reactor element.

A shunt control switch 461 is connected to a first end of the shunt control filter 460. The shunt control switch 461 may be connected in series to the shunt control filter 460. Additionally, the shunt control filter 460 and the shunt control switch 461 may be connected in parallel to the shunt filter 420.

The shunt control switch 461 may include a power semiconductor device. For example, the power semiconductor device may be an insulated gate bipolar transistor (IGBT), a power MOSFET, etc. In addition, the power semiconductor device may be controlled by a gate driver.

Figure 3:
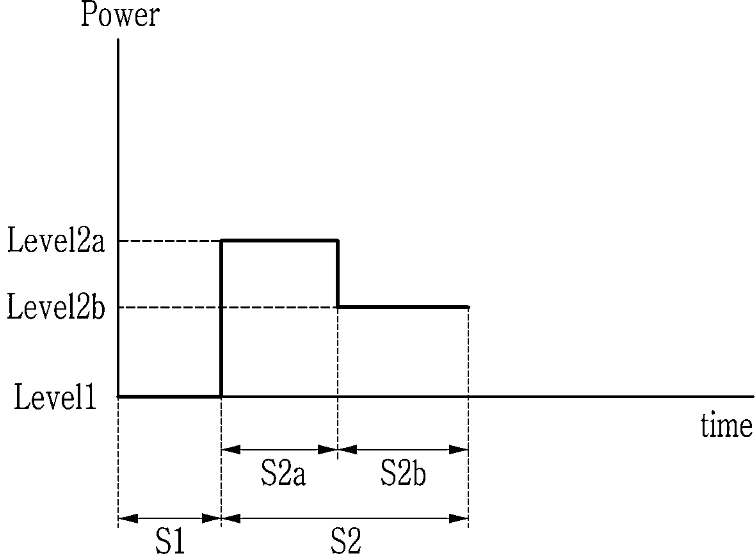
FIG. 3 illustrates a graph showing an output level of an excitation power supply according to various example embodiments.

FIG. 3 illustrates a graph showing an output level of an excitation power supply 33 according to various example embodiments.

A horizontal axis represents a time, and a vertical axis represents a power level.

Referring to FIG. 3, the excitation power supply 33 may have an output level (Level 1) of output power of 0 during an off period S1. The excitation power supply 33 may supply power of a positive level greater than 0 during an on period S2.

The excitation power supply 33 may supply power in a multi-level form during the on period S2. That is, the on period S2 may include at least two subperiods S2*a* and S2*b* during which powers of different levels are supplied. Additionally, the excitation power supply 33 may output powers of different levels during each of the subperiods S2*a* and S2*b*. A duration of each of the subperiods S2*a* and S2*b* may be from several nsec to hundreds of nsec.

For example, the on period S2 may include a first subperiod S2*a* and a second subperiod S2*b*.

The excitation power supply 33 may output a power of a first level Level2*a* during the first subperiod S2*a*. The excitation power supply 33 may output a power of a second level Level2*b* during the second subperiod S2*b*. The second level Level2*b* has a different magnitude from the first level Level2*a*. For example, the excitation power supply 33 may output a pulsed voltage or current such that the amplitude varies during each of the subperiods S2*a* and S2*b*, so as to cause a level of power to vary during each of the subperiods S2*a* and S2*b*.

In addition, the excitation power supply 33 may supply power such that the on periods S2 and off periods S1 between the on periods S2 exist. In this case, a duration of the off period S1 positioned between the on periods S2 may be from several nsec to hundreds of nsec.

In FIG. 3, a case where the first level Level2*a* is greater than the second level Level2*b* is illustrated. However, this is an example, and a magnitude relationship of each level may vary.

Figure 4:
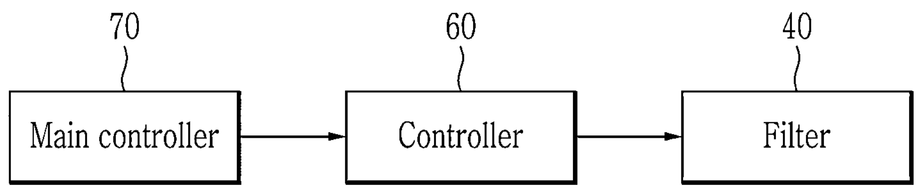
FIG. 4 illustrates a control relationship of a filter according to various example embodiments.

FIG. 4 illustrates a control relationship of the filter 40 according to various example embodiments.

Referring to FIG. 4, the controller 60 may control the filter 40. The controller 60 may change frequency characteristics of the filter 40 by controlling an on/off state of the shunt control switch 461 included in the filter 40. The controller 60 may change the on/off state of the shunt control switch 461 included in the filter 40 at least once during the on period S2. Accordingly, the frequency characteristic of filter 40 may be changed at least once during the on period S2.

For example, the substrate processing apparatus 1 may further include a main controller 70. The main controller 70 may be provided with recipe data for substrate processing stored therein. Additionally, the main controller 70 may control the components of the substrate processing apparatus 1 according to the recipe data so that the substrate is processed according to the recipe data.

The main controller 70 may be provided with schedule data according to which an operating state of the excitation power supply 33 is changed. That is, the main controller 70 may be provided with data related to a time point at which the excitation power supply 33 changes from the off period S1 to the on period S2. In addition, the main controller 70 may be provided with data related to a time point at which the excitation power supply 33 changes from the on period S2 to the off period S1. Additionally, the main controller 70 may be provided with data related to a time point at which the excitation power supply 33 changes from one subperiod S2*a* or S2*b* to another subperiod S2*a* or S2*b*. In addition, the main controller 70 may operate the excitation power supply 33 according to schedule data.

The main controller 70 may be provided with bias schedule data according to which an operating state of the bias power supply 35 is changed. The bias schedule data may be data related to a time point at which an on/off state of the bias switch 351 is changed.

The controller 60 may receive the schedule data from the main controller 70. In addition, the controller 60 may operate the filter 40 according to the schedule data. The controller 60 may change an on/off state of the shunt control switch 461 included in the filter 40 at a time point corresponding to the time point at which a power level changes during the on period S2. That is, the controller 60 may change the on/off state of the shunt control switch 461 included in the filter 40 in response to a time point at which the excitation power supply 33 changes from one subperiod S2*a* or S2*b* to another subperiod S2*a* or S2*b*, In this case, changing the on/off state of the shunt control switch 461 indicates that the shunt control switch 461 is changed from the on state to the off state, or from the off state to the on state.

Accordingly, the frequency characteristics of the filter 40 may be changed in response to the time point at which the excitation power supply 33 changes from one subperiod S2*a* or S2*b* to another subperiod S2*a* or S2*b*, Accordingly, the filter 40 may have different frequency characteristics during each of the subperiods S2*a* and S2*b*.

In addition, the controller 60 may receive bias the bias schedule data from the main controller 70. In addition, the controller 60 may operate the filter 40 according to the bias schedule data. The controller 60 may change the on/off state of the shunt control switch 461 included in the filter 40 in response to a time point at which an output state of the bias power supply 35 is changed. For example, the controller 60 may change the on/off state of the shunt control switch 461 included in the filter 40 in response to a time point at which an on/off state of the bias switch 351 is changed. Accordingly, the frequency characteristic of the filter 40 may be changed in response to the time point at which an output of the bias power supply 35 is changed.

Figure 5:
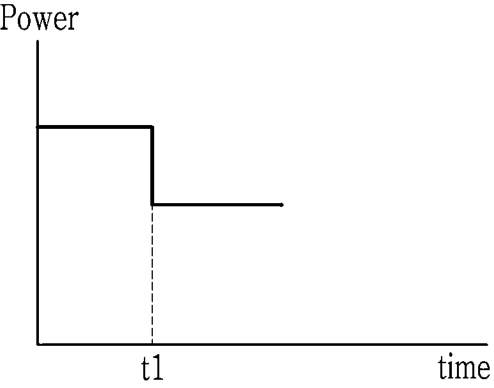
FIG. 5 illustrates a graph showing changes in an output of an excitation power supply and an output of a bias power supply according to various example embodiments.
Figure 5:
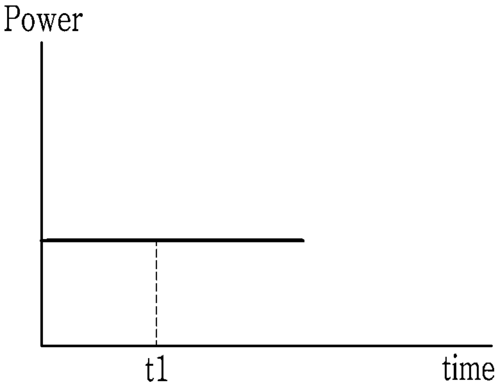

FIG. 5 illustrates a graph showing changes in an output of the excitation power supply 33 and an output of the bias power supply 35 according to various example embodiments.

The output of the excitation power supply 33 is shown at the top, and the output of the bias power supply 35 is shown at the bottom. A horizontal axis represents a time, and a vertical axis represents an output power. The output power refers to the change in level, and a low state level of the output of the excitation power supply 33 and an output level of the bias power supply 35 may be 0 or a real value greater than 0.

Referring to FIG. 5, while the level of the output of the bias power supply 35 is maintained during processing of the substrate, there may occur a time point t1 at which the output level of the excitation power supply 33 is changed. In this case, the shunt control switch 461 may operate in an on state if the output of the excitation power supply 33 is at a low level and in an off state if the output of the excitation power supply 33 is at a high level. That is, as illustrated in FIG. 5, if the output level of the excitation power supply 33 is changed from a high state to a low state, the shunt control switch 461 may be changed from the off state to the on state in response to the time point t1 at which the output level of the excitation power supply 33 is changed. Conversely, if the output level of the excitation power supply 33 is changed from a low state to a high state, the shunt control switch 461 may be changed from the on state to the off state in response to the time point at which the output level of the excitation power supply 33 is changed.

Figure 6:
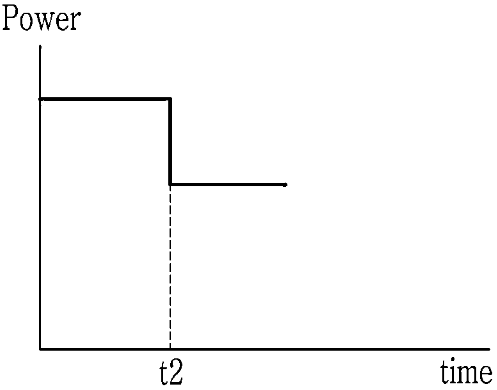
FIG. 6 illustrates a graph showing changes in an output of an excitation power supply and an output of a bias power supply according to various example embodiments.
Figure 6:
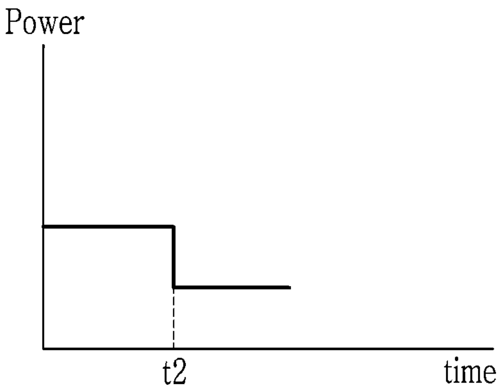

FIG. 6 illustrates a graph showing changes in an output of the excitation power supply 33 and an output of the bias power supply 35 according to various example embodiments.

The output of the excitation power supply 33 is shown at the top, and the output of the bias power supply 35 is shown at the bottom. A horizontal axis represents a time, and a vertical axis represents an output power. The output power indicate a change in level, and the low state level may be 0 or a real number greater than 0.

Referring to FIG. 6, during processing of the substrate, there may occur a time point t2 at which the output level of the excitation power supply 33 is changed. Additionally, the output level of the bias power supply 35 may be changed in response to the time point t2 at which the output level of the excitation power supply 33 is changed. In this case, the output level of the excitation power supply 33 and an output level of the bias level may be changed in a same form. That is, if the output level of the excitation power supply 33 is lowered, the output level of the bias level may also be lowered.

In this case, the shunt control switch 461 may operate in an on state if the output of the excitation power supply 33 is at a low level and in an off state if the output of the excitation power supply 33 is at a high level. That is, as illustrated in FIG. 6, if the output level of the excitation power supply 33 is changed from a high state to a low state, the shunt control switch 461 may be changed from the off state to the on state in response to the time point t2 at which the output level of the excitation power supply 33 is changed. Conversely, if the output level of the excitation power supply 33 is changed from a low state to a high state, the shunt control switch 461 may be changed from the on state to the off state in response to the time point at which the output level of the excitation power supply 33 is changed.

Figure 7:
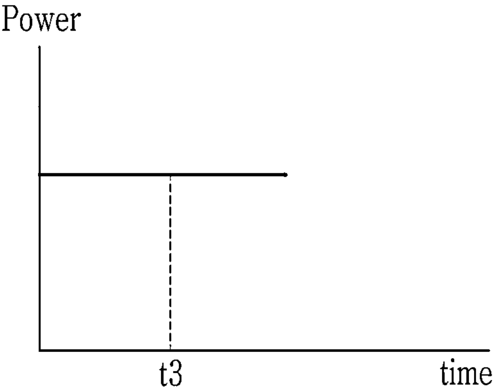
FIG. 7 illustrates a graph showing changes in an output of an excitation power supply and an output of a bias power supply according to various example embodiments.
Figure 7:
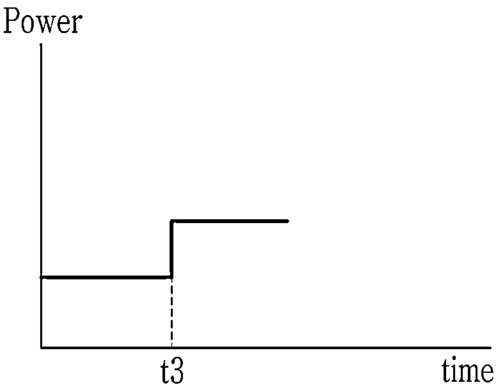

FIG. 7 illustrates a graph showing changes in an output of the excitation power supply 33 and an output of the bias power supply 35 according to various example embodiments.

The output of the excitation power supply 33 is shown at the top, and the output of the bias power supply 35 is shown at the bottom. A horizontal axis represents a time, and a vertical axis represents an output power. The output power refers to the change in level, and a low an output level of the excitation power supply 33 and a low output level of the bias power supply 35 may be 0 or a real value greater than 0.

Referring to FIG. 7, while the level of the output of the excitation power supply 33 is maintained during processing of the substrate, there may occur a time point t3 at which the output level of the bias power supply 35 is changed. In this case, the shunt control switch 461 may operate in an on state if the output of the bias power supply 35 is at a high level and in an off state if the output of the bias power supply 35 is at a low level. That is, as illustrated in FIG. 7, if the output level of the bias power supply 35 is changed from a low state to a high state, the shunt control switch 461 may be changed from the off state to the on state in response to the time point t3 at which the output level of the bias power supply 35 is changed. Conversely, if the output level of the bias power supply 35 is changed from a high state to a low state, the shunt control switch 461 may be changed from the on state to the off state in response to the time point at which the output level of the bias power supply 35 is changed.

In the substrate processing apparatus 1, a state of plasma excited inside the chamber 10 may change during a process. That is, the state of the plasma may be changed according to the power supplied by the excitation power supply 33, the power supplied by the bias power supply 35, etc. Changes in the state of the plasma cause changes in impedance of the plasma. Changes in the impedance of the plasma affect the operating characteristics of the filter 40. Changes in the operating characteristics of the filter 40 distort an output waveform of the bias power supply 35 that passes through the filter 40.

In the substrate processing apparatus 1 according to various example embodiments, the frequency characteristics of the filter 40 may be changed in response to a time point at which the state of plasma is changed. That is, if the output level of the excitation power supply 33 or the output level of the bias power supply 35 is changed, the state of the plasma may be changed. Accordingly, the impedance of the filter 40 may be changed according to a change in the on/off state of the shunt control switch 461 at a time point corresponding to a change in the output level of the excitation power supply 33, thereby changing the frequency characteristics. In addition, the impedance of the filter 40 may be changed at a time point corresponding to a change in the output level of the bias power supply 35, thereby changing the frequency characteristics. As a result, even if the state of plasma is changed during a substrate processing process, distortion of an output waveform of the bias power supply 35 that passes through the filter 40 may be minimized. Accordingly, a sheath state, a concentration state of plasma on the substrate, a state of incidence of ions on the substrate, etc. may be effectively adjusted in a region adjacent to the upper surface of the support 20 by the power supplied by the bias power supply 35.

Figure 8:
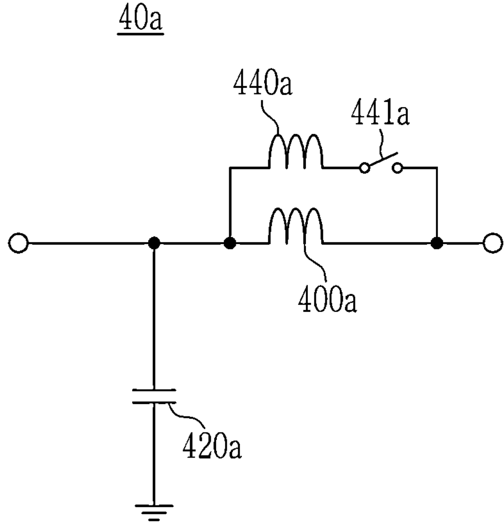
FIG. 8 illustrates a filter according to various example embodiments.

FIG. 8 illustrates a filter **40*a*** according to various example embodiments.

Referring to FIG. 8, the filter **40*a* according to various example embodiments may include a series filter 400*a*, a shunt filter 420*a*, and a series control filter 440*a***.

A first end of the series filter **400*a* is connected in a direction of the output terminal 352 of the bias power supply 35. A second end of the series filter 400*a* is connected in a direction of the support 20. A second end of the series filter 400*a* is connected in a direction of the lower electrode 23. The series filter 400*a* is provided as a passive element. The series filter 400*a* may be provided as a reactance element. The series filter 400*a*** may be provided as an inductive reactor element.

A first end of the shunt filter **420*a* is connected in a direction of the output terminal 352 of the bias power supply 35. A first end of the shunt filter 420*a* may be connected to a first end of the series filter 400*a*. A second end of the shunt filter 420*a* is connected to ground. The shunt filter 420*a* is provided as a passive element. The shunt filter 420*a* may be provided as a reactance element. The shunt filter 420*a*** may be provided as a capacitive reactor element.

The series control filter **440*a* is connected in parallel to the series filter 400*a*. The series control filter 440*a* is provided as a passive element. The series control filter 440*a* may be provided as a reactance element. The series control filter 440*a*** may be provided as an inductive reactor element.

A series control switch **441*a* is connected to a first end of the series control filter 440*a*. The series control switch 441*a* may be connected in series to the series control filter 440*a***.

Additionally, the series control filter 440a and the series control switch 441a may be connected in parallel to the series filter 400a.

The series control switch 441a may include a power semiconductor device. For example, the power semiconductor device may be an insulated gate bipolar transistor (IGBT), a power MOSFET, etc. In addition, the power semiconductor device may be controlled by a gate driver.

As illustrated in FIG. 5 described above, while the level of the output of the bias power supply 35 is maintained during processing of the substrate, there may occur a time point at which the output level of the excitation power supply 33 is changed. In this case, the series control switch 441a may operate in an on state if the output of the excitation power supply 33 is at a low level and in an off state if the output of the excitation power supply 33 is at a high level. That is, as illustrated in FIG. 5, if the output level of the excitation power supply 33 is changed from a high state to a low state, the series control switch 441a may be changed from the off state to the on state in response to the time point t1 at which the output level of the excitation power supply 33 is changed. Conversely, if the output level of the excitation power supply 33 is changed from a low state to a high state, the series control switch 441a may be changed from the on state to the off state in response to the time point at which the output level of the excitation power supply 33 is changed.

As illustrated in FIG. 6 described above, during processing of the substrate, there may occur a time point t2 at which the output level of the excitation power supply 33 is changed. Additionally, the output level of the bias power supply 35 may be changed in response to the time point t2 at which the output level of the excitation power supply 33 is changed. In this case, if the output level of the excitation power supply 33 is lowered, the output level of the bias level may also be lowered.

In this case, the series control switch 441a may operate in an on state if the output of the excitation power supply 33 is at a low level and in an off state if the output of the excitation power supply 33 is at a high level. That is, as illustrated in FIG. 6, if the output level of the excitation power supply 33 is changed from a high state to a low state, the series control switch 441a may be changed from the off state to the on state in response to the time point t2 at which the output level of the excitation power supply 33 is changed. Conversely, if the output level of the excitation power supply 33 is changed from a low state to a high state, the series control switch 441a may be changed from the on state to the off state in response to the time point at which the output level of the excitation power supply 33 is changed.

As illustrated in FIG. 7 described above, while the level of the output of the excitation power supply 33 is maintained during processing of the substrate, there may occur a time point t3 at which the output level of the bias power supply 35 is changed. In this case, the series control switch 441a may operate in an on state if the output of the bias power supply 35 is at a high level and in an off state if the output of the bias power supply 35 is at a low level. That is, as illustrated in FIG. 7, if the output level of the bias power supply 35 is changed from a low state to a high state, the series control switch 441a may be changed from the off state to the on state in response to the time point t3 at which the output level of the bias power supply 35 is changed. Conversely, if the output level of the bias power supply 35 is changed from a high state to a low state, the series control switch 441a may be changed from the on state to the off state in response to the time point at which the output level of the bias power supply 35 is changed.

Figure 9:
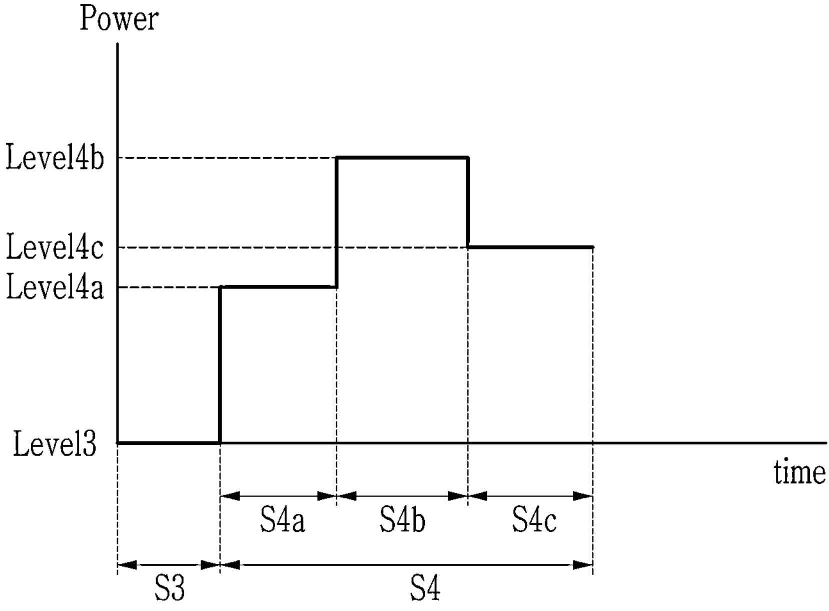
FIG. 9 illustrates a graph showing an output of an excitation power supply according to various example embodiments.

FIG. 9 illustrates a graph showing an output of the excitation power supply 33 according to various example embodiments.

A horizontal axis represents a time, and a vertical axis represents a power.

Referring to FIG. 9, the excitation power supply 33 may have a level of output power of 0 during an off period S3. The excitation power supply 33 may supply power of a positive level greater than 0 during an on period S4.

An on period S4 may include three or more sub-periods S4a, S4b, and S4c that supply powers of different levels. Additionally, the excitation power supply 33 may output powers of different levels during each of the subperiods S4a, S4b and S4c. A duration of each of the subperiods S4a, S4b and S4c may be from several nsec to hundreds of nsec.

For example, the on period S4 may include a first subperiod S4a, a second subperiod S4b, and a third subperiod S4c.

The excitation power supply 33 may output a power of a first level Level4a during the first subperiod S4a.

The excitation power supply 33 may output a power of a second level Level4b during the second subperiod S4b. The second level Level4b has a different magnitude from the first level Level4a.

The excitation power supply 33 may output a power of a third level Level4c during the third subperiod S4c. The third level Level4c has a different magnitude from the first level Level4a and the second level Level4b.

In addition, the excitation power supply 33 may supply power such that on periods S4 and off periods S4 between the on periods S4 exist. In this case, a duration of the off period S3 positioned between the on periods S4 may be from several nsec to hundreds of nsec.

For example, the excitation power supply 33 may output a pulsed voltage or current such that the amplitude varies during each of the subperiods S4a, S4b, and S4c, so as to cause a level of power to vary during each of the subperiods S4a, S4b, and S4c.

In FIG. 9, the second level Level4b is greater than the first level Level4a and the third level Level4c, and the third level Level4c is greater than the first level Level4a. However, this is an example, and a magnitude relationship of each level may vary.

Figure 10:
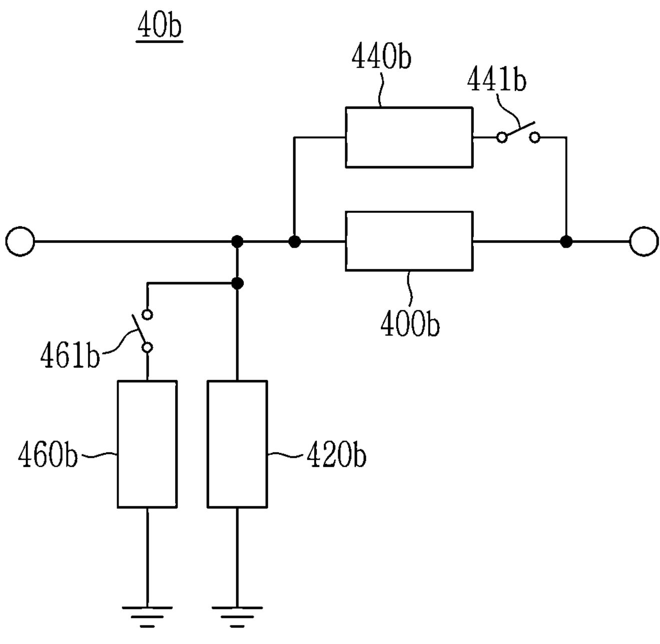
FIG. 10 illustrates a filter according to various example embodiments.

FIG. 10 illustrates a filter 40b according to various example embodiments.

Referring to FIG. 10, the filter 40b according to various example embodiments may include a series filter 400b, a shunt filter 420b, a series control filter 440b, and a shunt control filter 460b.

A first end of the series filter 400b is connected in a direction of the output terminal 352 of the bias power supply 35. A second end of the series filter 400b is connected in a direction of the support 20. A second end of the series filter 400b is connected in a direction of the lower electrode 23. The series filter 400b is provided as a passive element. The series filter 400b may be provided as a reactance element. The series filter 400b may have one of a structure in which an inductive reactance element, a capacitive reactance element, an inductive reactance element and a capacitive reactance element are connected in series and a structure in which an inductive reactance element and a capacitive reactance element are connected in parallel.

A first end of the shunt filter 420b is connected in a direction of the output terminal 352 of the bias power supply 35. A first end of the shunt filter 420b may be connected to a first end of the series filter 400_b_. A second end of the shunt filter 420_b_ is connected to ground. The shunt filter 420_b_ is provided as a passive element. The shunt filter 420_b_ may be provided as a reactance element. The shunt filter 420_b_ may have one of a structure in which an inductive reactance element, a capacitive reactance element, an inductive reactance element and a capacitive reactance element are connected in series and a structure in which an inductive reactance element and a capacitive reactance element are connected in parallel.

The series control filter 440_b_ is connected in parallel to the series filter 400_b_. The series control filter 440_b_ is provided as a passive element. The series control filter 440_b_ may be provided as a reactance element. The series control filter 440_b_ may have one of a structure in which an inductive reactance element, a capacitive reactance element, an inductive reactance element and a capacitive reactance element are connected in series and a structure in which an inductive reactance element and a capacitive reactance element are connected in parallel.

A series control switch 441_b_ is connected to a first end of the series control filter 440_b_. The series control switch 441_b_ may be connected in series to the series control filter 440_b_. Additionally, the series control filter 440_b_ and the series control switch 441_b_ may be connected in parallel to the series filter 400_b_.

The shunt control filter 460_b_ is connected in parallel to the shunt filter 420_b_. The shunt control filter 460_b_ is provided as a passive element. The shunt control filter 460_b_ may be provided as a reactance element. The shunt control filter 460_b_ may have one of a structure in which an inductive reactance element, a capacitive reactance element, an inductive reactance element and a capacitive reactance element are connected in series and a structure in which an inductive reactance element and a capacitive reactance element are connected in parallel.

A shunt control switch 461_b_ is connected to a first end of the shunt control filter 460_b_. The shunt control switch 461_b_ may be connected in series to the shunt control filter 460_b_. Additionally, the shunt control filter 460_b_ and the shunt control switch 461_b_ may be connected in parallel to the shunt filter 420_b_.

The control switches 441_b_ and 461_b_ may include a power semiconductor device. For example, the power semiconductor device may be an insulated gate bipolar transistor (IGBT), a power MOSFET, etc. In addition, the power semiconductor device may be controlled by a gate driver.

The filter 40_b_ may be controlled by a control 60. The controller 60 may change frequency characteristics of the filter 40_b_ by controlling on/off states of the control switches 441_b_ and 461_b_ included in the filter 40_b_. As described above with reference to FIGS. 3 to 8, the on/off states of the control switches 441_b_ and 461_b_ may be changed in response to a time point at which a level of the excitation power supply 33 is changed.

The controller 60 may change the on/off states of the control switches 441_b_ and 461_b_ included in the filter 40_b_ at least once during the on periods S2 and S4 of the excitation power supply 33. Accordingly, the frequency characteristics of the filter 40_b_ may be changed at least once during the on periods S2 and S4 of the excitation power supply 33.

The on/off states of the control switches 441_b_ and 461_b_ may be changed to be different during the on periods S2 and S4 and the off periods S1 and S3 of the excitation power supply 33. That is, the plasma has different impedances during the on periods S2 and S4 and the off periods S1 and S3 of the excitation power supply 33. Accordingly, the on/off states of the control switches 441_b_ and 461_b_ of the filter 40_b_ are different during the on periods S2 and S4 and the off periods S1 and S3 of the excitation power supply 33. That is, the frequency characteristics of the filter 40_b_ are different during the on periods S2 and S4 and the off periods S1 and S3 of the excitation power supply 33.

In addition, even if there are three subperiods S4_a_, S4_b_, and S4_c_ as shown in FIG. 9, the on/off states of the control switches 441_b_ and 461_b_ may be changed to be different during each of the subperiods S4_a_, S4_b_, and S4_c_ of the excitation power supply 33. That is, the plasma has different impedances during each of the subperiods S4_a_, S4_b_, and S4_c_ of the excitation power supply 33. Accordingly, the on/off states of the control switches 441_b_ and 461_b_ of the filter 40_b_ may be different during each of the subperiods S4_a_, S4_b_, and S4_c_ of the excitation power supply 33. That is, the filter 40_b_ may have different frequency characteristics during each of the subperiods S4_a_, S4_b_, and S4_c_ of the excitation power supply 33.

Figure 11:
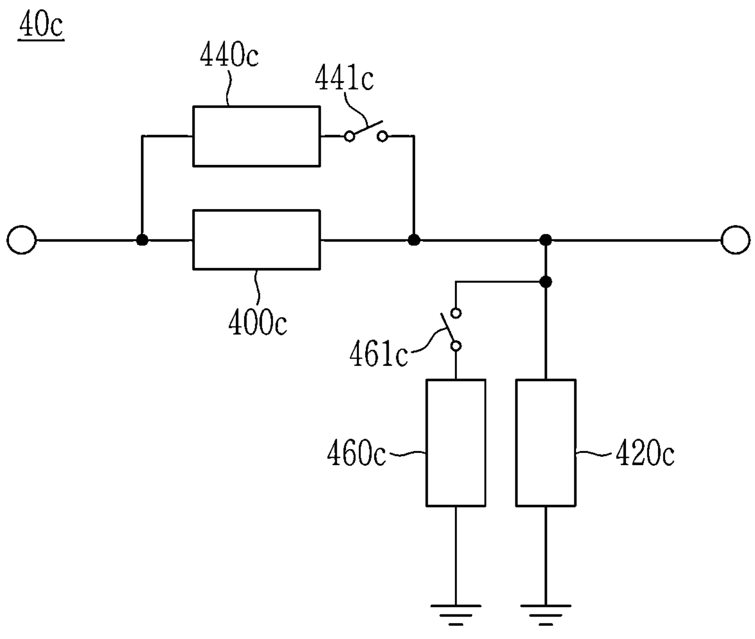
FIG. 11 illustrates a filter according to various example embodiments.

FIG. 11 illustrates a filter 40_c_ according to various example embodiments.

Referring to FIG. 11, the filter 40_c_ according to various example embodiments may include a series filter 400_c_, a shunt filter 420_c_, a series control filter 440_c_, and a shunt control filter 460_c_.

A first end of the series filter 400_c_ is connected in a direction of the output terminal 352 of the bias power supply 35. A second end of the series filter 400_c_ is connected in a direction of the support 20. A second end of the series filter 400_c_ is connected in a direction of the lower electrode 23. The series filter 400_c_ is provided as a passive element. The series filter 400_c_ may be provided as a reactance element. The series filter 400_c_ may have one of a structure in which an inductive reactance element, a capacitive reactance element, an inductive reactance element and a capacitive reactance element are connected in series and a structure in which an inductive reactance element and a capacitive reactance element are connected in parallel.

A first end of the shunt filter 420_c_ may be connected to a second end of the series filter 400_c_. A first end of the shunt filter 420_c_ is connected in a direction of the support 20. A first end of the shunt filter 420_c_ is connected in a direction of the lower electrode 23. A second end of the shunt filter 420_c_ is connected to ground. The shunt filter 420_c_ is provided as a passive element. The shunt filter 420_c_ may be provided as a reactance element. The shunt filter 420_c_ may have one of a structure in which an inductive reactance element, a capacitive reactance element, an inductive reactance element and a capacitive reactance element are connected in series and a structure in which an inductive reactance element and a capacitive reactance element are connected in parallel.

The series control filter 440_c_ is connected in parallel to the series filter 400_c_. The series control filter 440_c_ is provided as a passive element. The series control filter 440_c_ may be provided as a reactance element. The series control filter 440_c_ may have one of a structure in which an inductive reactance element, a capacitive reactance element, an inductive reactance element and a capacitive reactance element are connected in series and a structure in which an inductive reactance element and a capacitive reactance element are connected in parallel.

A series control switch 441_c_ is connected to a first end of the series control filter 440_c_. The series control switch 441_c_ may be connected in series to the series control filter 440_c_.

Additionally, the series control filter 440*c* and the series control switch 441*c* may be connected in parallel to the series filter 400*c*.

The shunt control filter 460*c* is connected in parallel to the shunt filter 420*c*. The shunt control filter 460*c* is provided as a passive element. The shunt control filter 460*c* may be provided as a reactance element. The shunt control filter 460*c* may have one of a structure in which an inductive reactance element, a capacitive reactance element, an inductive reactance element and a capacitive reactance element are connected in series and a structure in which an inductive reactance element and a capacitive reactance element are connected in parallel.

A shunt control switch 461*c* is connected to a first end of the shunt control filter 460*c*. The shunt control switch 461*c* may be connected in series to the shunt control filter 460*c*. Additionally, the shunt control filter 460*c* and the shunt control switch 461*c* may be connected in parallel to the shunt filter 420*c*.

The control switches 441*c* and 461*c* may include a power semiconductor device. For example, the power semiconductor device may be an insulated gate bipolar transistor (IGBT), a power MOSFET, etc. In addition, the power semiconductor device may be controlled by a gate driver.

The filter 40*c* may be controlled by a control 60. The controller 60 may change frequency characteristics of the filter 40*c* by controlling on/off states of the control switches 441*c* and 461*c* included in the filter 40*c*. As described above with reference to FIGS. 3 to 8, the on/off states of the control switches 441*c* and 461*c* may be changed in response to a time point at which a level of the excitation power supply 33 is changed. The controller 60 may change the on/off states of the control switches 441*c* and 461*c* included in the filter 40*c* at least once during the on periods S2 and S4 of the excitation power supply 33. The on/off states of the control switches 441*c* and 461*c* may be changed to be different during the on periods S2 and S4 and the off periods S1 and S3 of the excitation power supply 33. In addition, even if there are three subperiods S4*a*, S4*b*, and S4*c* as shown in FIG. 9, the on/off states of the control switches 441*c* and 461*c* may be changed to be different during each of the subperiods S4*a*, S4*b*, and S4*c* of the excitation power supply 33. A method of changing the on/off states of the control switches 441*c* and 461*c* is similar to that of the filter 40*b* of FIG. 10, so repeated descriptions are omitted.

Additionally, one of the series control filter 440*c* and the shunt control filter 460*c* may be omitted.

Figure 12:
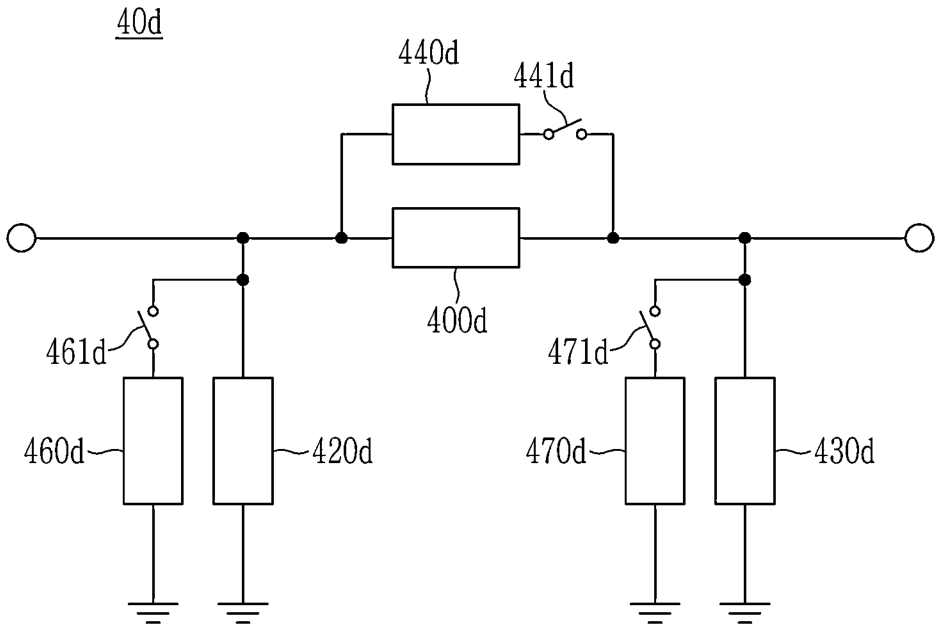
FIG. 12 illustrates a filter according to various example embodiments.

FIG. 12 illustrates a filter 40*d* according to various example embodiments.

Referring to FIG. 12, the filter 40*d* according to various example embodiments may include a series filter 400*d*, a first shunt filter 420*d*, a second shunt filter 430*d*, a series control filter 440*d*, a first shunt control filter 460*d*, and a second shunt control filter 467*d*.

A first end of the series filter 400*d* is connected in a direction of the output terminal 352 of the bias power supply 35. A second end of the series filter 400*d* is connected in a direction of the support 20. A second end of the series filter 400*d* is connected in a direction of the lower electrode 23. The series filter 400*d* is provided as a passive element. The series filter 400*d* may be provided as a reactance element. The series filter 400*d* may have one of a structure in which an inductive reactance element, a capacitive reactance element, an inductive reactance element and a capacitive reactance element are connected in series and a structure in which an inductive reactance element and a capacitive reactance element are connected in parallel.

A first end of the first shunt filter 420*d* is connected in a direction of the output terminal 352 of the bias power supply 35. A first end of the first shunt filter 420*d* may be connected to a first end of the series filter 400*d*. A second end of the first shunt filter 420*d* is connected to ground. The first shunt filter 420*d* is provided as a passive element. The first shunt filter 420*d* may be provided as a reactance element. The first shunt filter 420*d* may have one of a structure in which an inductive reactance element, a capacitive reactance element, an inductive reactance element and a capacitive reactance element are connected in series and a structure in which an inductive reactance element and a capacitive reactance element are connected in parallel.

A first end of the second shunt filter 430*d* may be connected to a second end of the series filter 400*d*. A first end of the second shunt filter 430*d* is connected in a direction of the support 20. A first end of the second shunt filter 430 is connected in a direction of the lower electrode 23. A second end of the second shunt filter 430*d* is connected to ground. The second shunt filter 430*d* is provided as a passive element. The second shunt filter 430*d* may be provided as a reactance element. The second shunt filter 430*d* may have one of a structure in which an inductive reactance element, a capacitive reactance element, an inductive reactance element and a capacitive reactance element are connected in series and a structure in which an inductive reactance element and a capacitive reactance element are connected in parallel.

The series control filter 440*d* is connected in parallel to the series filter 400*d*. The series control filter 440*d* is provided as a passive element. The series control filter 440*d* may be provided as a reactance element. The series control filter 440*d* may have one of a structure in which an inductive reactance element, a capacitive reactance element, an inductive reactance element and a capacitive reactance element are connected in series and a structure in which an inductive reactance element and a capacitive reactance element are connected in parallel.

A series control switch 441*d* is connected to a first end of the series control filter 440*d*. The series control switch 441*d* may be connected in series to the series control filter 440*d*. Additionally, the series control filter 440*d* and the series control switch 441*d* may be connected in parallel to the series filter 400*d*.

The first shunt control filter 460*d* is connected in parallel to the first shunt filter 420*d*. The first shunt control filter 460*d* is provided as a passive element. The first shunt control filter 460*d* may be provided as a reactance element. The first shunt control filter 460*d* may have one of a structure in which an inductive reactance element, a capacitive reactance element, an inductive reactance element and a capacitive reactance element are connected in series and a structure in which an inductive reactance element and a capacitive reactance element are connected in parallel.

A first shunt control switch 461*d* is connected to a first end of the first shunt control filter 460*d*. The first shunt control switch 461*d* may be connected in series to the first shunt control filter 460*d*. Additionally, the first shunt control filter 460*d* and the first shunt control switch 461*d* may be connected in parallel to the first shunt filter 420*d*.

The second shunt control filter 467*d* is connected in parallel to the second shunt filter 430*d*. The second shunt control filter 470*d* is provided as a passive element. The second shunt control filter 470*d* may be provided as a reactance element. The second shunt control filter 470*d* may have one of a structure in which an inductive reactance element, a capacitive reactance element, an inductive reactance element and a capacitive reactance element are connected in series and a structure in which an inductive reactance element and a capacitive reactance element are connected in parallel.

A second shunt control switch 471*d* is connected to a first end of the second shunt control filter 470*d*. The second shunt control switch 471*d* may be connected in series to the second shunt control filter 470*d*. Additionally, the second shunt control filter 470*d* and the second shunt control switch 471*d* may be connected in parallel to the second shunt filter 430*d*.

The control switches 441*d*, 461*d*, and 471*d* may include a power semiconductor device. For example, the power semiconductor device may be an insulated gate bipolar transistor (IGBT), a power MOSFET, etc. However, example embodiments are not limited thereto. In addition, the power semiconductor device may be controlled by a gate driver.

The filter 40*d* may be controlled by a control 60. The controller 60 may change frequency characteristics of the filter 40*d* by controlling on/off states of the control switches 441*d*, 461*d*, and 471*d* included in the filter 40*d*. As described above with reference to FIGS. 3 to 8, the on/off states of the control switches 441*d*, 461*d*, and 471*d* may be changed in response to a time point at which a level of the excitation power supply 33 is changed. The controller 60 may change the on/off states of the control switches 441*d*, 461*d*, and 471*d* included in the filter 40*d* at least once during the on periods S2 and S4 of the excitation power supply 33. The on/off states of the control switches 441*d*, 461*d*, and 471*d* may be changed to be different during the on periods S2 and S4 and the off periods S1 and S3 of the excitation power supply 33. In addition, even if there are three or more subperiods S4*a*, S4*b*, and S4*c*, the on/off states of the control switches 441*d*, 461*d*, and 471*d* may be changed to be different during each of the subperiods S4*a*, S4*b*, and S4*c* of the excitation power supply 33. Changing the on/off states of the control switches 441*d*, 461*d*, and 471*d* is the same as or similar to that of the filter 40*b* of FIG. 10, so repeated descriptions are omitted.

Additionally, one or two of the series control filter 440*d*, the first shunt control filter 460*d*, and the second shunt control filter 470*d* may be omitted.

Figure 13:
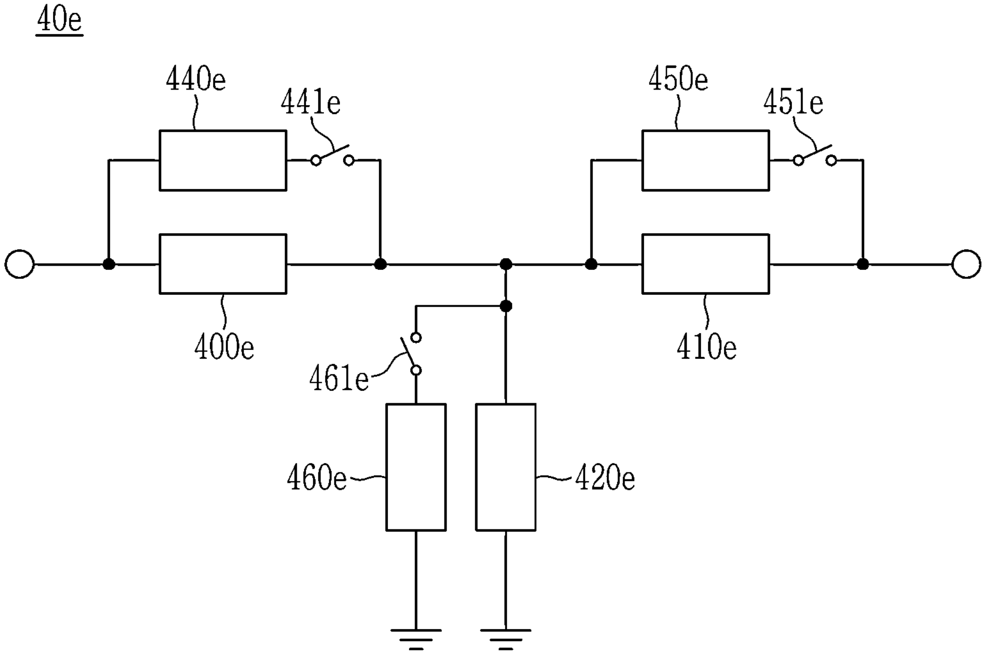
FIG. 13 illustrates a filter according to various example embodiments.

FIG. 13 illustrates a filter 40*e* according to various example embodiments.

Referring to FIG. 13, the filter 40*e* according to various example embodiments may include a first series filter 400*e*, a second series filter 410*e*, a shunt filter 420*e*, a first series control filter 440*e*, a second series control filter 450*e*, and a shunt control filter 460*e*.

A first end of the first series filter 400*e* is connected in a direction of the output terminal 352 of the bias power supply 35. The first series filter 400*e* is provided as a passive element. The first series filter 400*e* may be provided as a reactance element. The first series filter 400*e* may have one of a structure in which an inductive reactance element, a capacitive reactance element, an inductive reactance element and a capacitive reactance element are connected in series and a structure in which an inductive reactance element and a capacitive reactance element are connected in parallel.

The second series filter 410*e* is connected in series to the first series filter 400*e*. A first end of the second series filter 410*e* is connected to a second end of the first series filter 400*e*. A second end of the second series filter 410*e* is connected in a direction of the support 20. A second end of the second series filter 410*e* is connected in a direction of the lower electrode 23. The second series filter 410*e* is provided as a passive element. The second series filter 410*e* may be provided as a reactance element. The second series filter 410*e* may have one of a structure in which an inductive reactance element, a capacitive reactance element, an inductive reactance element and a capacitive reactance element are connected in series and a structure in which an inductive reactance element and a capacitive reactance element are connected in parallel.

A first end of the shunt filter 420*e* may be connected between a second end of the first series filter 400*e* and a first end of the second series filter 410*e*. A second end of the shunt filter 420*e* is connected to ground. The shunt filter 420*e* is provided as a passive element. The shunt filter 420*e* may be provided as a reactance element. The shunt filter 420*e* may have one of a structure in which an inductive reactance element, a capacitive reactance element, an inductive reactance element and a capacitive reactance element are connected in series and a structure in which an inductive reactance element and a capacitive reactance element are connected in parallel.

The first series control filter 440*e* is connected in parallel to the first series filter 400*e*. The first series control filter 440*e* is provided as a passive element. The first series control filter 440*e* may be provided as a reactance element. The first series control filter 440*e* may have one of a structure in which an inductive reactance element, a capacitive reactance element, an inductive reactance element and a capacitive reactance element are connected in series and a structure in which an inductive reactance element and a capacitive reactance element are connected in parallel.

A first series control switch 441*e* is connected to a first end of the first series control filter 440*e*. The first series control switch 441*e* may be connected in series to the first series control filter 440*e*. Additionally, the first series control filter 440*e* and the first series control switch 441*e* may be connected in parallel to the first series filter 400*e*.

The second series control filter 450*e* is connected in parallel to the second series filter 410*e*. The second series control filter 450*e* is provided as a passive element. The second series control filter 450*e* may be provided as a reactance element. The second series control filter 450*e* may have one of a structure in which an inductive reactance element, a capacitive reactance element, an inductive reactance element and a capacitive reactance element are connected in series and a structure in which an inductive reactance element and a capacitive reactance element are connected in parallel.

A second series control switch 451*e* is connected to a first end of the second series control filter 450*e*. The second series control switch 451*e* may be connected in series to the second series control filter 450*e*. Additionally, the second series control filter 450*e* and the second series control switch 451*e* may be connected in parallel to the second series filter 410*e*.

The shunt control filter 460*e* is connected in parallel to the shunt filter 420*e*. The shunt control filter 460*e* is provided as a passive element. The shunt control filter 460*e* may be provided as a reactance element. The shunt control filter 460*e* may have one of a structure in which an inductive reactance element, a capacitive reactance element, an inductive reactance element and a capacitive reactance element are connected in series and a structure in which an inductive reactance element and a capacitive reactance element are connected in parallel.

A shunt control switch 461*e* is connected to a first end of the shunt control filter 460*e*. The shunt control switch 461*e* may be connected in series to the shunt control filter 460*e*.

Additionally, the shunt control filter 460*e* and the shunt control switch 461*e* may be connected in parallel to the shunt filter 420*e*.

The control switches 441*e*, 451*e*, and 461*e* may include a power semiconductor device. For example, the power semiconductor device may be an insulated gate bipolar transistor (IGBT), a power MOSFET, etc. However, example embodiments are not limited thereto. In addition, the power semiconductor device may be controlled by a gate driver.

The filter 40*e* may be controlled by a control 60. The controller 60 may change frequency characteristics of the filter 40*e* by controlling on/off states of the control switches 441*e*, 451*e*, and 461*e* included in the filter 40*e*. As described above with reference to FIGS. 3 to 8, the on/off states of the control switches 441*e*, 451*e*, and 461*e* may be changed in response to a time point at which a level of the excitation power supply 33 is changed. The controller 60 may change the on/off states of the control switches 441*e*, 451*e*, and 461*e* included in the filter 40*e* at least once during the on periods S2 and S4 of the excitation power supply 33. The on/off states of the control switches 441*e*, 451*e*, and 461*e* may be changed to be different during the on periods S2 and S4 and the off periods S1 and S3 of the excitation power supply 33. In addition, even if there are three or more subperiods S4*a*, S4*b*, and S4*c*, the on/off states of the control switches 441*e*, 451*e*, and 461*e* may be changed to be different during each of the subperiods S4*a*, S4*b*, and S4*c* of the excitation power supply 33. Changing the on/off states of the control switches 441*e*, 451*e*, and 461*e* is the same as or similar to that of the filter 40*b* of FIG. 10, so repeated descriptions are omitted.

Additionally, one or two of the first series control filter 440*e*, the second series control filter 450*e*, and the shunt control filter 460*e* may be omitted.

Figure 14:
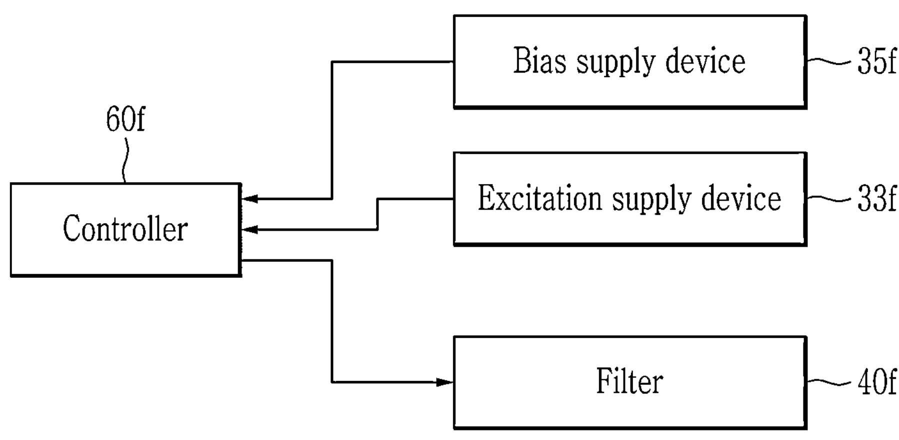
FIG. 14 illustrates a control relationship according to various example embodiments.

FIG. 14 illustrates a control relationship according to various example embodiments.

Referring to FIG. 14, a controller 60*f* may control a filter 40*f*. The controller 60*f* may be provided to receive schedule data for changing an operating state of an excitation power supply 33*f* from the excitation power supply 33*f*. Additionally, the controller 60*f* may control the filter 40*f* in response to a time point at which an output level of the excitation power supply 33*f* is changed according to the schedule data.

In addition, the controller 60*f* may be provided to receive bias schedule data for changing an operating state of a bias power supply 35*f* from the bias power supply 35*f*. Additionally, the controller 60*f* may control the filter 40*f* in response to a time point at which an output level of the excitation power supply 33*f* is changed according to the bias schedule data. In addition, the filter 40*f* may have a same configuration as one of the filter 40 in FIG. 2, the filter 40*a* in FIG. 8, the filter 40*b* in FIG. 10, the filter 40*c* in FIG. 11, the filter 40*d* in FIG. 12, and the filter 40*e* in FIG. 13.

A method by which the controller 60*f* controls the filter 40*f* according to the schedule data and the bias schedule data is the same or similar to what was described above with reference to FIGS. 2 to 13, and thus repeated descriptions will be omitted.

Figure 15:
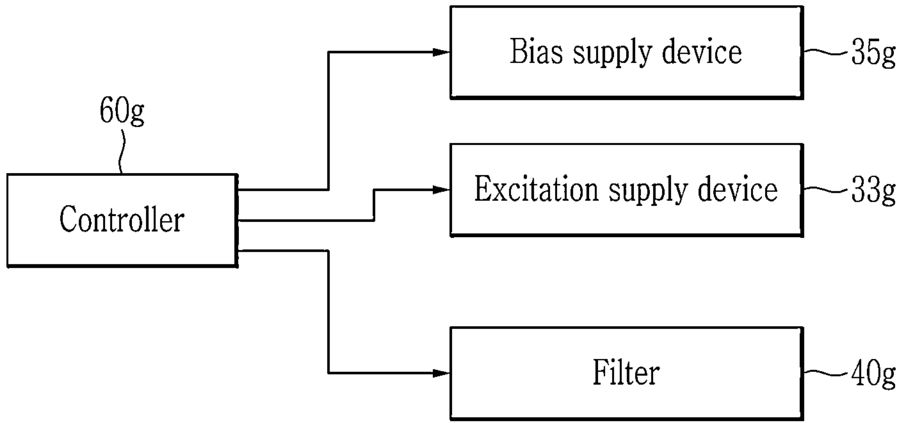
FIG. 15 illustrates a control relationship according to various example embodiments.

FIG. 15 illustrates a control relationship according to various example embodiments.

Referring to FIG. 15, a controller 60*g* may control a filter 40*g*. The controller 60*g* may be provided with schedule data according to which an operating state of an excitation power supply 33*g* is changed. In addition, the controller 60*g* may control the excitation power supply 33*g* and the filter 40*g* according to schedule data.

Additionally, the controller 60*g* may be provided with bias schedule data according to which an operating state of a bias power supply 35*g* is changed. In addition, the controller 60*g* may control the bias power supply 35*g* and the filter 40*g* according to bias schedule data. In addition, the filter 40*g* may have a same configuration as one of the filter 40 in FIG. 2, the filter 40*a* in FIG. 8, the filter 40*b* in FIG. 10, the filter 40*c* in FIG. 11, the filter 40*d* in FIG. 12, and the filter 40*e* in FIG. 13.

A method by which the controller 60*g* controls the filter 40*g* according to the schedule data and the bias schedule data is the same or similar to what was described above with reference to FIGS. 2 to 13, and thus repeated descriptions will be omitted.

Figure 16:
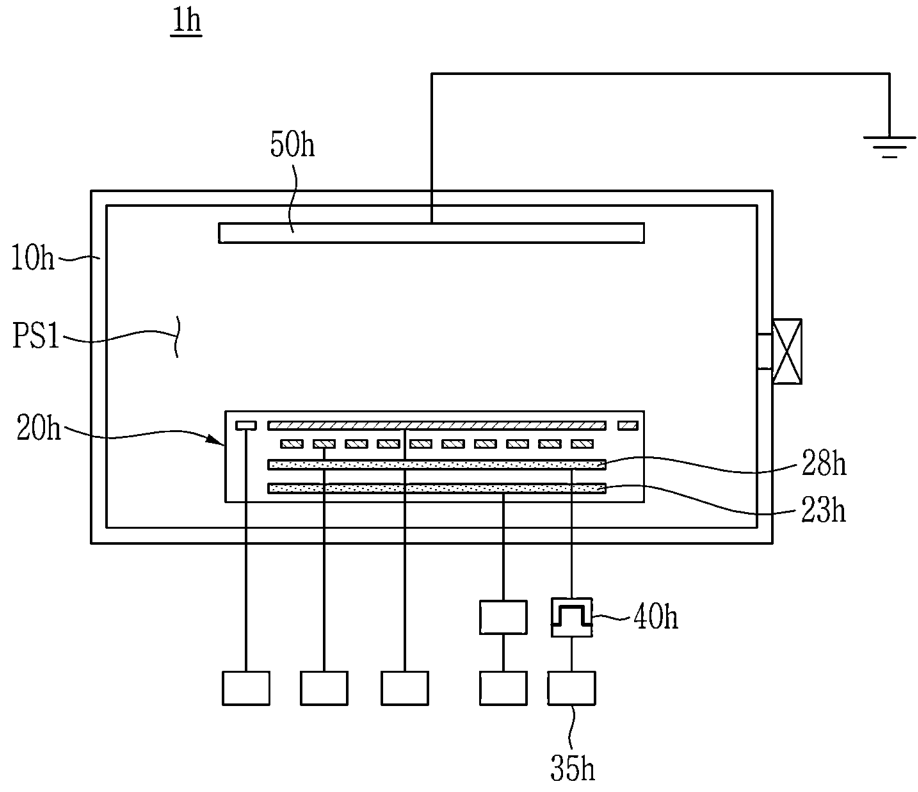
FIG. 16 illustrates a substrate processing according to various example embodiments.

FIG. 16 illustrates a substrate processing apparatus 1*h* according to various example embodiments.

Referring to FIG. 16, the substrate processing apparatus 1*h* according to various example embodiments may include a chamber 10*h*, a support 20*h*, and a plasma excitation plate 50*h*.

The chamber 10*h* provides a process space PS1 within which a substrate processing process is performed.

The support 20*h* is disposed inside the chamber 10*h*.

A lower electrode 23*h* may be disposed inside the support 20*h*.

A bias electrode 28*h* may be disposed inside the support 20*h*. A bias power supply 35*h* may be connected to the support 20*h*. The bias power supply 35*h* may be electrically connected to the bias electrode 28*h*. The bias power supply 35*h* may be electrically connected to the bias electrode 28*h* through the filter 40*h*.

Except that the bias electrode 28*h* is provided separately from the lower electrode 23*h*, the substrate processing apparatus 1*h* is the same or similar to the substrate processing apparatus 1 of FIG. 1, and thus repeated descriptions will be omitted.

In addition, the filter 40*h* may have a same configuration as one of the filter 40 in FIG. 2, the filter 40*a* in FIG. 8, the filter 40*b* in FIG. 10, the filter 40*c* in FIG. 11, the filter 40*d* in FIG. 12, and the filter 40*e* in FIG. 13. Additionally, a control method of the filter 40*h* is the same or similar to that described above with reference to FIGS. 2 to 15. Accordingly, repeated descriptions are omitted.

Figure 17:
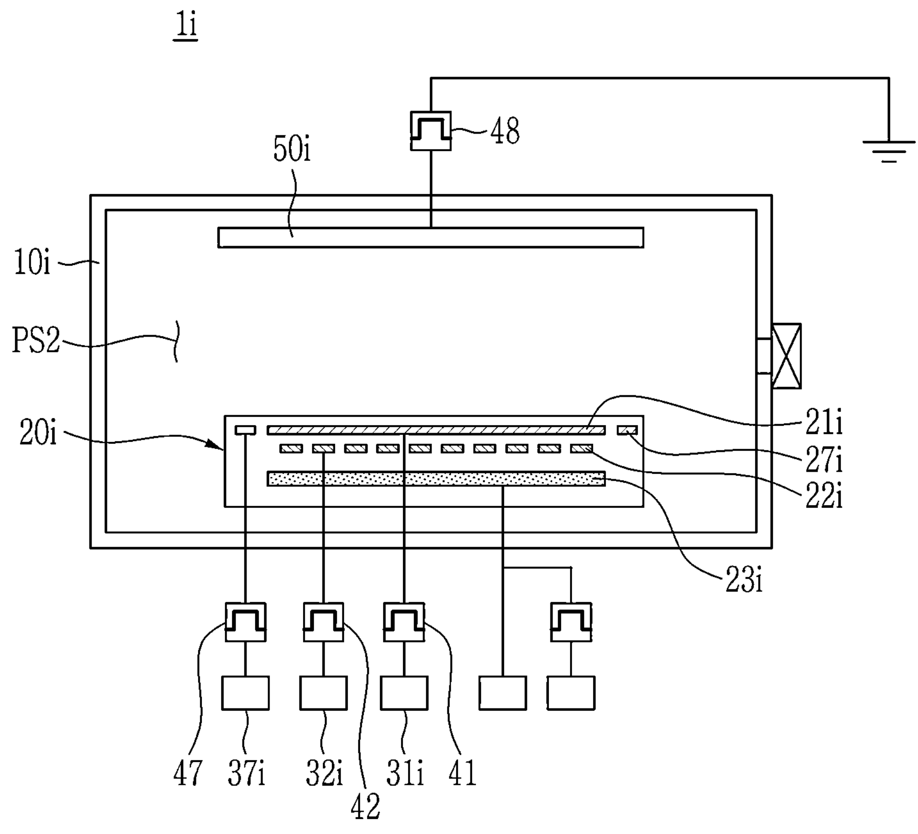
FIG. 17 illustrates a substrate processing according to various example embodiments.

FIG. 17 illustrates a substrate processing apparatus 1*i* according to various example embodiments.

Referring to FIG. 17, the substrate processing apparatus 1*i* according to various example embodiments may include a chamber 10*i*, a support 20*i*, and a plasma excitation plate 50*i*.

The chamber 10*i* provides a process space PS2 within which a substrate processing process is performed.

The support 20*i* is disposed inside the chamber 10*i*.

A fixing electrode 21*i* may be disposed inside the support 20*i*. A fixing power supply 31*i* may be connected to the support 20*i*. The fixing power supply 31*i* may be electrically connected to the fixing electrode 21*i*. The fixing power supply 31*i* may be electrically connected to the fixing electrode 21*i* through a fixing filter 41. That is, the fixing filter 41 may be connected to the support 20*i* to be disposed between the support 20*i* and the fixing power supply 31*i*.

A heating electrode 22*i* may be disposed inside the support 20*i*. A heater power supply 32*i* may be connected to the support 20*i*. The heater power supply 32*i* may be electrically connected to the heating electrode 22*i*. The heater power supply 32*i* may be electrically connected to the heating electrode 22*i* through a heating filter 42. That is, the heating filter 42 may be connected to the support 20*i* to be disposed between the support 20*i* and the heater power supply 32*i*.

A lower electrode 23$i$ may be disposed inside the support 20$i$. An edge bias electrode 27$i$ may be disposed in the support 20$i$. The edge bias electrode 27$i$ may be disposed at an upper end portion of an edge region of support 20$i$. An edge bias power supply 37$i$ may be connected to the support 20$i$. The edge bias power supply 37$i$ may be electrically connected to the edge bias electrode 27$i$. The edge bias power supply 37$i$ may be electrically connected to the edge bias electrode 27$i$ through an edge filter 47. That is, the edge filter 47 may be connected to the support 20$i$ to be disposed between the support 20$i$ and the edge bias power supply 37$i$.

The plasma excitation plate 50$i$ allows energy for excitation of plasma to be applied to the process space PS2. The plasma excitation plate 50$i$ may be grounded. An auxiliary filter 48 may be connected to the plasma excitation plate 50$i$. That is, the plasma excitation plate 50$i$ may be grounded through the auxiliary filter 48.

The fixing filter 41, the heating filter 42, the edge filter 47, and the auxiliary filter 48 may have a same configuration as one of the filter 40 in FIG. 2, the filter 40$a$ in FIG. 8, the filter 40$b$ in FIG. 10, the filter 40$c$ in FIG. 11, the filter 40$d$ in FIG. 12, and the filter 40$e$ in FIG. 13.

In a case of the fixing filter 41, a direction of the output terminal 352 of the bias power supply 35 is replaced by the direction of an output end of the fixing power supply 31$i$.

In a case of the heating filter 42, a direction of the output terminal 352 of the bias power supply 35 is replaced by the direction of an output end of the heater power supply 32$i$.

In a case of the edge filter 47, a direction of the output terminal 352 of the bias power supply 35 is replaced by the direction of an output end of the edge bias power supply 37$i$.

In a case of the auxiliary filter 48, a direction of the output terminal 352 of the bias power supply 35 is replaced by a ground direction.

In addition, a control method of the fixing filter 41, the heating filter 42, the edge filter 47, and the auxiliary filter 48 is the same or similar to that described above with reference to FIGS. 2 to 15. Accordingly, repeated descriptions are omitted.

In addition, except for providing the fixing filter 41, the heating filter 42, the edge filter 47, and the auxiliary filter 48, the substrate processing apparatus 1$i$ is the same or similar to the substrate processing apparatus 1 of FIG. 1 or the substrate processing apparatus 1$h$ of FIG. 16, repeated descriptions are omitted.

Plasma excited in the process space PS2 generates high frequencies. If such high frequencies are introduced into each component of the substrate processing device 1$i$, operating characteristics of the components may deteriorate or malfunctions may occur.

In addition, the substrate processing device 1$i$ according to various example embodiments may block or reduce a flow of high frequencies generated in the plasma into each component, thereby improving operation characteristics and reducing or preventing malfunctions.

Any of the elements disclosed above may include and/or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While this disclosure has been described in connection with what is presently considered to be practical example embodiments, it is to be understood that the disclosure is not limited to the disclosed example embodiments, but, on the contrary, is intended to cover various modifications and equivalent dispositions included within the spirit and scope of the appended claims.

What is claimed is:

1. A substrate processing apparatus comprising:
a chamber;
an excitation power supply configured to generate a supply power for plasma excitation;
a support inside the chamber configured to support a substrate;
a filter connected to the support; and
a controller,
wherein the controller is configured to change frequency characteristics of the supply power by changing an impedance of the filter with a timing that is based on a timing of a change in an output level of the excitation power supply.

2. The substrate processing apparatus of claim 1, further comprising
a bias power supply connected to the support and configured to supply bias power,
wherein the bias power supply is connected to the support through the filter.

3. The substrate processing apparatus of claim 1, wherein:
the filter includes one or more switches, and
the controller is configured to change the one or more switches between on and off states with a timing based on the timing of the change in the output level of the excitation power supply.

4. The substrate processing apparatus of claim 1, wherein:
the excitation power supply is configured to supply a first positive level of power in a first time period of an on period and a second positive level of power in a second time period of the on period, wherein the first positive level is different from the second positive level, and
wherein the controller is configured to change the impedance of the filter at a time point corresponding to a time point at which the output level of the excitation power supply changes from the first positive level to the second positive level.

5. The substrate processing apparatus of claim 4, wherein;
the first positive level is greater than the second positive level, and
the controller is configured to change a switch of the filter from an off state to an on state in response to the output level changing from the first positive level to the second positive level.

6. The substrate processing apparatus of claim 1, further comprising:
a fixing electrode inside the support; and
a fixing power supply electrically connected to the fixing electrode through the filter.

7. The substrate processing apparatus of claim 1, further comprising:
a heater inside the support; and
a heater power supply electrically connected to the heater through the filter.

8. The substrate processing apparatus of claim 1, further comprising:
an edge bias electrode in the support; and
an edge bias power supply connected to the edge bias electrode through the filter.

9. The substrate processing apparatus of claim 1, further comprising a plasma excitation plate configured to supply plasma excitation energy into the chamber, wherein the plasma excitation plate is grounded through the filter.

10. A substrate processing apparatus comprising:

a chamber;

an excitation power supply configured to generate a supply power for plasma excitation;

a support inside the chamber configured to support a substrate;

a bias power supply connected to the support to supply bias power;

a plasma excitation plate configured to supply plasma excitation energy into the chamber;

a filter connected to the support or the plasma excitation plate; and a controller, wherein the controller is configured to change frequency characteristics of the supply power by changing an impedance of the filter with a timing that is based on a timing of a change in an output level of the excitation power supply or a timing of a change in an output level of the bias power supply.

11. The substrate processing apparatus of claim 10, wherein:

the controller is configured to change the impedance of the filter based on the output level of the excitation power supply changing during a time period in which the output level of the bias power supply is maintained constant.

12. The substrate processing apparatus of claim 10, wherein:

the filter is configured to change the impedance of the filter at a time point that corresponds to a time point at which the output level of the excitation power supply and the output level of the bias power supply change.

13. The substrate processing apparatus of claim 10, wherein;

the controller is configured to change the impedance of the filter based on the output level of the bias power supply changing during a time period in which the output level of the excitation power supply is maintained constant.

14. A substrate processing apparatus comprising:

a chamber;

an excitation power supply configured to generate a supply power for plasma excitation;

a support inside the chamber configured to support a substrate;

a bias power supply connected to the support and configured to supply bias power; and a filter connected between the support and the bias power supply, and wherein the filter includes one or more switches, wherein the one or more switches are configured to change frequency characteristics of the supply power by changing between on and off states based on an output level of the excitation power supply changing or an output level of the bias power supply changing.

15. The substrate processing apparatus of claim 14, wherein the filter further includes:

a series filter configured to have a first end connected in a direction of an output end of the bias power supply and a second end connected in a direction of the support, a shunt filter configured to have a first end connected in a direction of the output end of the bias power supply and a second end connected to ground, and a shunt control filter connected in series with a first switch of the one or more switches and connected in parallel to the shunt filter together with the first switch.

16. The substrate processing apparatus of claim 14, wherein the filter further includes:

a series filter configured to have a first end connected in a direction of an output end of the bias power supply and a second end connected in a direction of the support, a shunt filter configured to have a first end connected in a direction of the output end of the bias power supply and a second end connected to ground, and a series control filter connected in series with a first switch of the one or more switches and connected in parallel to the series filter together with the first switch.

17. The substrate processing apparatus of claim 14, wherein the filter further includes:

a series filter configured to have a first end connected in a direction of an output end of the bias power supply and a second end connected in a direction of the support, a shunt filter configured to have a first end connected in a direction of the output end of the bias power supply and a second end connected to ground, a series control filter connected in series with a series control switch included in the one or more switches and connected in parallel to the series filter together with the series control switch, and a shunt control filter connected in series with a shunt control switch included in the one or more switches and connected in parallel to the shunt filter together with the shunt control switch.

18. The substrate processing apparatus of claim 14, wherein the filter further includes:

a series filter configured to have a first end connected in a direction of an output end of the bias power supply and a second end connected in a direction of the support, a shunt filter configured to have a first end connected to a second end of the series filter, and a second end connected to ground; and a control filter connected in series with a first switch of the one or more switches and connected in parallel to the series filter or the shunt filter together with the first switch.

19. The substrate processing apparatus of claim 14, wherein the filter further includes:

a series filter configured to have a first end connected in a direction of an output end of the bias power supply and a second end connected in a direction of the support;

a first shunt filter configured to have a first end connected in a direction of the output end of the bias power supply and a second end connected to ground;

a second shunt filter configured to have a first end connected to a second end of the series filter, and a second end connected to ground; and a control filter connected in series with a first switch of the one or more switches and connected in parallel to at least one of the series filter, the first shunt filter, or the second shunt filter together with the first switch.

20. The substrate processing apparatus of claim 14, wherein the filter further includes:

a first series filter configured to have a first end connected in a direction of an output end of the bias power supply;

a second series filter configured to have a first end connected to a second end of the first series filter and a second end connected in a direction of the support;

a shunt filter configured to have a first end connected between the second end of the first series filter and the first end of the second series filter and a second end connected to ground; and a control filter connected in series to one or more switches and connected in parallel to at least one first series filter, the second series filter, and the shunt filter together with one or more switches.

* * * * *